US011380609B2

(12) United States Patent
Xu et al.

(10) Patent No.: US 11,380,609 B2
(45) Date of Patent: Jul. 5, 2022

(54) MICROELECTRONIC ASSEMBLIES HAVING CONDUCTIVE STRUCTURES WITH DIFFERENT THICKNESSES ON A CORE SUBSTRATE

(71) Applicant: Intel Corporation, Santa Clara, CA (US)

(72) Inventors: Cheng Xu, Chandler, AZ (US); Jiwei Sun, Chandler, AZ (US); Ji Yong Park, Chandler, AZ (US); Kyu Oh Lee, Chandler, AZ (US); Yikang Deng, Chandler, AZ (US); Zhichao Zhang, Chandler, AZ (US); Liwei Cheng, Chandler, AZ (US); Andrew James Brown, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 897 days.

(21) Appl. No.: 15/985,348

(22) Filed: May 21, 2018

(65) Prior Publication Data
US 2019/0355654 A1    Nov. 21, 2019

(51) Int. Cl.
*H01L 23/498* (2006.01)
*H01L 23/00* (2006.01)
*H01L 21/48* (2006.01)

(52) U.S. Cl.
CPC ...... *H01L 23/49838* (2013.01); *H01L 21/486* (2013.01); *H01L 21/4857* (2013.01); *H01L 23/49822* (2013.01); *H01L 23/49827* (2013.01); *H01L 23/562* (2013.01); *H01L 24/16* (2013.01); *H01L 2224/16227* (2013.01); *H01L 2924/14* (2013.01); *H01L 2924/1421* (2013.01);
(Continued)

(58) Field of Classification Search
CPC ......... H01L 23/49838; H01L 23/49827; H01L 24/16; H01L 21/4857; H01L 21/486; H01L 23/49822; H01L 23/562; H01L 2924/20641; H01L 2224/16227; H01L 2924/1432; H01L 2924/1421; H01L 2924/14252; H01L 2924/14; H01L 2924/2064; H01L 24/81; H01L 2224/81203; H01L 2224/83203; H01L 24/13; H01L 24/29; H01L 24/32; H01L 2224/32225; H01L 24/83; H01L 2224/131; H01L 2224/831; H01L 2224/92125; H01L 2224/73204; H01L 2224/83102; H01L 2224/2919
See application file for complete search history.

(56) References Cited

U.S. PATENT DOCUMENTS 9,232,639 B2    1/2016    Zhang et al.
9,806,011 B2 *  10/2017   Zhang ............... H01L 23/49822
(Continued)

FOREIGN PATENT DOCUMENTS

WO    2017171824 A1    10/2017

*Primary Examiner* — Victor A Mandala
(74) *Attorney, Agent, or Firm* — Patent Capital Group

(57) ABSTRACT

Microelectronic assemblies, and related devices and methods, are disclosed herein. For example, in some embodiments, a microelectronic assembly may include a package substrate having a core substrate with a first conductive structure having a first thickness on the core substrate, and a second conductive structure having a second thickness on the core substrate, where the first thickness is different than the second thickness.

20 Claims, 13 Drawing Sheets

(52) U.S. Cl.
CPC ............. *H01L 2924/1432* (2013.01); *H01L 2924/14252* (2013.01); *H01L 2924/2064* (2013.01); *H01L 2924/20641* (2013.01)

(56) References Cited

U.S. PATENT DOCUMENTS

| | | | | |
|---|---|---|---|---|
| 10,009,992 | B2* | 6/2018 | Vrtis | H05K 1/111 |
| 10,692,847 | B2* | 6/2020 | Sobieski | H01L 23/147 |
| 10,923,439 | B2* | 2/2021 | Tsuchida | H01L 24/16 |
| 10,966,324 | B2* | 3/2021 | Hitsuoka | H05K 1/11 |
| 10,971,461 | B2* | 4/2021 | Tsai | H01Q 21/065 |
| 2006/0017133 | A1* | 1/2006 | Oi | H05K 1/185 |
| | | | | 257/924 |
| 2011/0162876 | A1* | 7/2011 | Arvin | C25D 5/022 |
| | | | | 174/257 |
| 2013/0200531 | A1* | 8/2013 | Myung | H01L 23/49822 |
| | | | | 174/250 |
| 2013/0333924 | A1* | 12/2013 | Hurwitz | H01L 23/49822 |
| | | | | 174/257 |
| 2014/0090767 | A1* | 4/2014 | Paul | B32B 27/285 |
| | | | | 156/60 |
| 2016/0066423 | A1* | 3/2016 | Sakamoto | H01L 23/49822 |
| | | | | 29/846 |
| 2017/0053840 | A1 | 2/2017 | Basker et al. | |
| 2017/0194248 | A1* | 7/2017 | Das | H01L 23/49827 |
| 2018/0114739 | A1* | 4/2018 | Wang | H01L 23/3675 |
| 2019/0043800 | A1* | 2/2019 | Reingruber | H01L 23/49838 |
| 2019/0103348 | A1* | 4/2019 | Manepalli | C25D 5/022 |
| 2020/0211945 | A1* | 7/2020 | Huang | H01L 23/49822 |
| 2021/0280517 | A1* | 9/2021 | May | H01L 23/5386 |
| 2022/0044990 | A1* | 2/2022 | Machida | H05K 3/244 |
| 2022/0046801 | A1* | 2/2022 | Kasai | H01L 23/498 |

* cited by examiner

MICROELECTRONIC ASSEMBLIES HAVING CONDUCTIVE STRUCTURES WITH DIFFERENT THICKNESSES ON A CORE SUBSTRATE

BACKGROUND

Integrated circuit devices are conventionally coupled to a package substrate for mechanical stability and to facilitate connection to other components via conductive pathways in the package substrate, such as circuit boards.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1A:
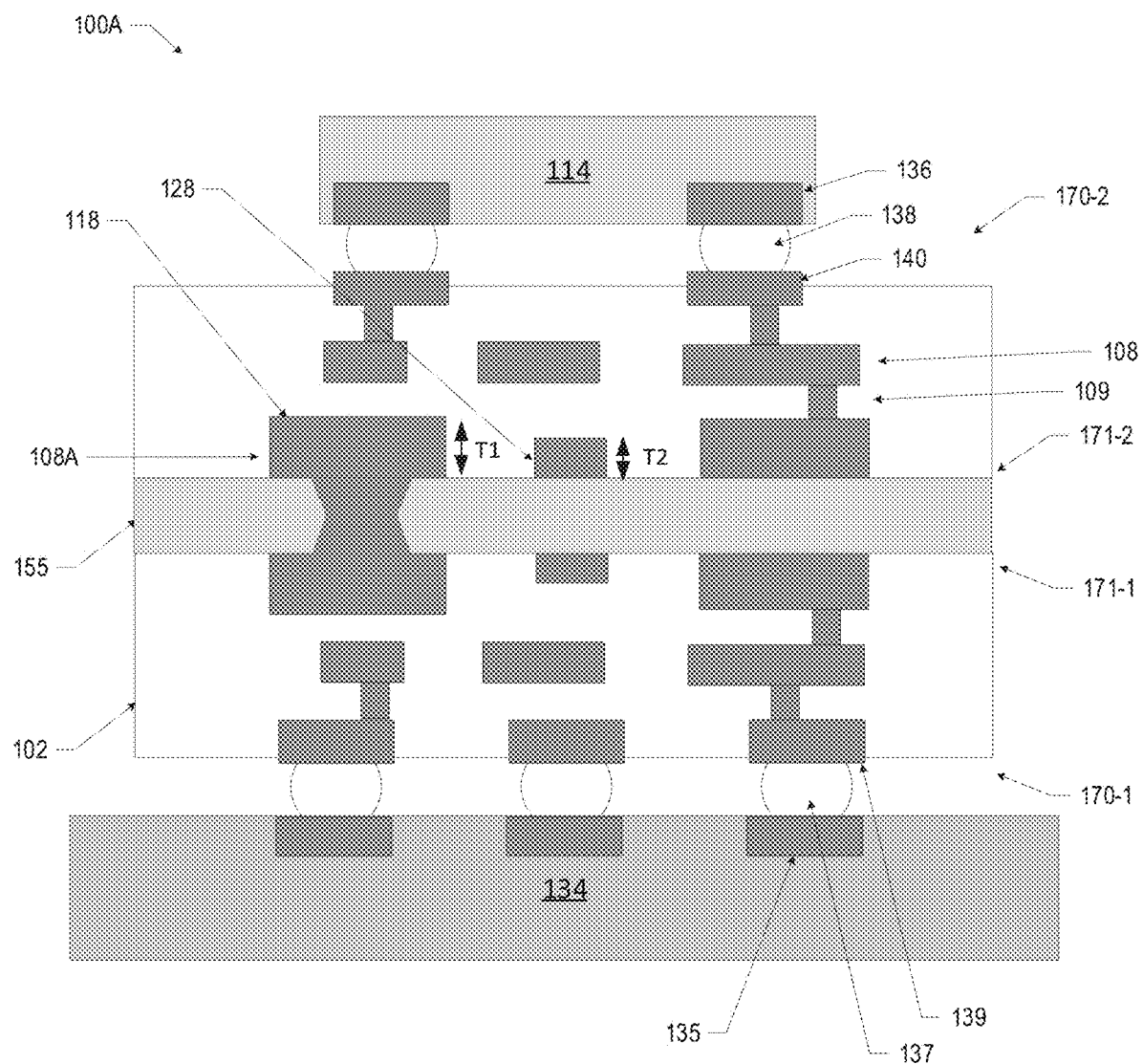
FIG. 1A is a side, cross-sectional view of an example microelectronic assembly, in accordance with various embodiments.

Microelectronic assemblies that include a core substrate having two or more conductive structures with different thicknesses thereon and related devices and methods, are disclosed herein. For example, in some embodiments, a microelectronic assembly may include a package substrate having a core substrate with a first conductive structure having a first thickness on the core substrate, and a second conductive structure having a second thickness on the core substrate, where the first thickness is different than the second thickness. In some embodiments, a microelectronic assembly may include a core substrate having a conductive layer on the core substrate, wherein the conductive layer includes a first conductive structure having a first thickness and a second conductive structure having a second thickness, where the second thickness is greater than the first thickness, and where the second conductive structure is electrically coupled to a power reference voltage or a ground reference voltage.

Communicating large numbers of signals in an integrated circuit (IC) package is challenging due to the increasingly small size of IC dies, thermal constraints, z-height constraints, form factor constraints, performance constraints, and power delivery constraints, among others. One of the main drivers for package design rules is the input/output (I/O) density of traces per mm per conductive layer (IO/mm/layer). This becomes even more challenging as I/O densities increase and the size of conductive pathways decrease. In conventional IC packages, I/O traces may not be on a core layer, which may result in reduced IC performance (e.g., increased crosstalk or reduced speed), and increased z-height. Various ones of the microelectronic assemblies disclosed herein may exhibit better power delivery, lower crosstalk, and increased signal speed while reducing the size of the package relative to conventional approaches. The microelectronic assemblies disclosed herein may be particularly advantageous for small and low-profile applications in computers, tablets, industrial robots, and consumer electronics (e.g., wearable devices).

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 2" may be used to refer to the collection of drawings of FIGS. 2A-2J, the phrase "FIG. 4" may be used to refer to the collection of drawings of FIGS. 4A-4F, etc. although certain elements may be referred to in the singular herein, such elements may include multiple sub-elements. For example, "an insulating material" may include one or more insulating materials.

As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, a portion of a conductive line or trace, or a portion of a conductive via). As used herein, "conductive pathways" may include conductive traces, pads, vias, and through-holes, and other conductive structures that electrically couple an IC package component to another IC package component or to another component external to the IC package. As used herein, the terms "conductive trace" and "conductive line" may be used interchangeably and may refer to an interconnect in a conductive layer. As used herein, "conductive structures," "conductive features," and "conductive elements" may be used interchangeably and may refer to a trace, a line, a plane, a pad, or other conductive component.

FIG. 1A is a side, cross-sectional view of a microelectronic assembly 100A, in accordance with various embodiments. The microelectronic assembly 100A may include a package substrate 102 having a core 155 with a plated through hole (PTH) 156. Package substrate 102 may include a plurality of conductive layers 108 and a plurality of dielectric layers 109 formed on core 155. In particular, package substrate 102, as shown, may include a core 155 (also referred to herein as a core layer, a core substrate, or a carrier), a first conductive layer 108A on the core 155 having a first conductive feature 118 with a first thickness (T1) and a second conductive feature 128 with a second thickness (T2), where the first thickness (T1) is different than the second thickness (T2). For example, as shown in FIG. 1A, the first thickness is greater than the second thickness. In some embodiments, the first and second conductive features may be first and second traces, respectively. In some embodiments, the first or second traces may be arranged to carry signals. For example, the first and second traces may be coupled to an electrical signal or a transmission line. In some embodiments, a first trace (e.g., 118) having a thinner dielectric layer above the trace may be a single-ended transmission line strip line. In some embodiments, a second trace (e.g., 128) having a thicker dielectric layer above the trace may be one of a differential pair. In some embodiments, the first or second traces may be arranged to carry power (e.g., a power signal), ground (e.g., a ground signal), or both. For example, the first and second traces may be coupled to a power plane, or a ground plane. In some embodiments, a first trace may have a first thickness that is greater than a second thickness and may be arranged to carry power or ground, and a second trace may have a second thickness that is less than the first thickness and may be arranged to carry a signal. In some embodiments, a first and/or second conductive feature may be a contact pad (e.g., a pad for the PTH 156), or a plane.

The plurality of conductive layers 108 and the plurality of dielectric layers may be formed on both sides of the core 155, but for simplicity, only the top side 171-2 of the core 155 is described in detail in FIG. 1A and applies equally in the descriptions of the other FIGS. The description of a metallization stack on the top side 171-2 of the core 155 applies equally to a metallization stack on the bottom side 171-1 of the core 155. In some embodiments, a metallization stack on the bottom side 171-1 of the core 155 may be the same (e.g., a mirror image) as a metallization stack on the top side 171-2 of core 155. In some embodiments, a metallization stack on the bottom side 171-1 of core 155 may be the different than a metallization stack on the top side 171-2 of core 155 (e.g., may have a different number of conductive layers, or may have different conductive pathways).

In some embodiments, the core 155 may be rigid to provide a flat and stable surface to facilitate tight design rules during manufacturing, or may be, for example, an ultra-thin core (UTC) to reduce z-height. The core 155 may be made of any suitable material, such as stainless steel, glass, silicon, fiber-glass reinforced epoxy, among others. In some embodiments, package substrate 102 may include a core 155 having a thickness between 200 microns and 500 microns (commonly referred to as a cored package substrate or a cored substrate) with build-up layers on both sides of the core. In some embodiments, package substrate 102 may include a core 155 having a thickness between 50 microns and 200 microns (commonly referred to as an UTC package substrate). In some embodiments, the top side 171-2 and bottom side 171-1 of core 155 may include a metal or foil layer (not shown), such that core 155 may be referred to as a nickel-clad carrier when the foil layer is nickel, or may be referred to as a copper clad carrier when the foil layer is copper, etc. In some embodiments, the first conductive layer 108A may be formed on the foil layer.

As shown in FIG. 1A, the core 155 may include one or more PTHs 156. A PTH 156 may be formed by mechanically drilling or laser drilling through the core 155 to form a through hole. The through hole may be plated with metal, such as copper, and filled (or plugged) with a conductive material, such as copper, or a dielectric material, such as epoxy, to form the PTH 156. In some embodiments, the core 155 does not include a PTH. A PTH is commonly be referred to as a laser through hole (LTH).

The plurality of conductive layers 108 may be formed using any suitable conductive material or materials, such as copper, or other metals or alloys, for example, and may be formed using any suitable technique, such as electroplating. An individual conductive layer 108 may include a single layer or may include multiple layers, for example, a conductive layer 108 may include a seed layer and a patterned trace layer. In some embodiments, a conductive layer 108 may be a patterned trace layer. In some embodiments, a conductive layer 108 may be a continuous layer. As described above, a reference to conductive layers 108, also refers to conductive layer 108A.

The plurality of dielectric layers 109 of the package substrate 102 may be formed using any suitable process, including, for example, chemical vapor deposition (CVD), film lamination, slit coating and curing, atomic layer deposition (ALD), or spin on process, among others, and with any suitable material. Examples of dielectric materials may be include, for example, epoxy-based materials/films, ceramic/silica filled epoxide films, polyimide films, filled polyimide films, other organic materials, and other inorganic dielectric materials known from semiconductor processing as well as silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). An individual dielectric layer 109 may include a single layer or may include multiple layers.

The package substrate 102 may include one or more conductive pathways through the dielectric material (e.g., including conductive traces and/or conductive vias, as shown). The conductive pathways may be formed using any suitable conductive material or materials, such as copper, silver, nickel, gold, aluminum, or other metals or alloys, for example. The conductive pathways may be formed using any suitable technique, such as electroplating. The conductive pathways in the package substrate 102 may be bordered by liner materials, such as adhesion liners and/or barrier liners, as suitable. Although FIG. 1A illustrates a specific number and arrangement of conductive pathways in the package of 102, these are simply illustrative, and any suitable number and arrangement may be used.

Microelectronic assembly 100A may include a die 114. The die 114 may be coupled to package substrate 102 by first level interconnects (FLI) 138 at the top surface 170-2 of the package substrate 102. In particular, the package substrate 102 may include conductive contacts 140 at its top surface 170-2, and the die 114 may include conductive contacts 136 at its bottom surface, the FLI 138 may electrically and mechanically couple the conductive contacts 136 and the conductive contacts 140. The FLI 138 illustrated in FIG. 1A are solder balls or solder bumps (e.g., for a ball grid array arrangement), but any suitable FLIs 138 may be used (e.g., pins in a pin grid array arrangement or lands in a land grid array arrangement).

The die 114 may include a semiconductor layer with active devices patterned on it (e.g. transistors, diodes, etc.), an insulating material (e.g., a dielectric material formed in multiple layers, or semiconductor material, as known in the art) and multiple conductive pathways formed through the insulating material. In some embodiments, the insulating material of a die 114 may include a dielectric material, such as silicon dioxide, silicon nitride, BT resin, polyimide materials, glass reinforced epoxy matrix materials, or low-k and ultra low-k dielectric (e.g., carbon doped dielectrics, fluorine-doped dielectrics, porous dielectrics, and organic polymeric dielectrics). For example, the die 114 may include a dielectric build-up film, such as Ajinomoto build-up film (ABF). In some embodiments, the insulating material of die 114 may be a semiconductor material, such as silicon, germanium, or a III-V material. In some embodiments, the die 114 may include silicon. The conductive pathways in die 114 may include conductive traces and/or conductive vias, and may connect any of the conductive contacts in the die 114 and any suitable manner (e.g., connecting multiple conductive contacts on a same surface of the die 114).

In some embodiments, the area between die 114 and package substrate 102 may be filled with underfill (not shown), which may be a mold compound or any other suitable material to fill the gap between the die 114 and the package substrate 102. Underfill may be applied using any suitable technique, such as transfer mold, capillary underfill, or epoxy flux as part of the thermal conductive bonding (TCB) process. In some embodiments, the underfill may extend beyond the area defined by die 114.

Although FIG. 1A depicts a single die 114, the microelectronic assembly 100A may have any suitable number of dies. In some embodiments, the die 114 may be an active or passive die that may include input/output circuitry, high bandwidth memory, or enhanced dynamic random access memory (EDRAM). For example, die 114 may include a processor (e.g., including transistors, arithmetic logic units, and other components) that may include a central processing unit (CPU), a graphics processing unit (GPU), or both. The processor may also include application specific integrated circuits (ASIC). In some embodiments, microelectronic assemblies disclosed herein may include a plurality of dies coupled to package substrate 102 or coupled to another die in a package-on-package (PoP) configuration. In some embodiments, the microelectronic assembly 100A may serve as a system-in-package (SiP) in which multiple dies having different functionality are included. In such embodiments, the microelectronic assembly may be referred to as an SiP.

The microelectronic assembly 100A of FIG. 1A may also include a circuit board 134. The package substrate 102 may be coupled to the circuit board 134 by second-level interconnects (SLI) 137 at the bottom surface 170-1 of the package substrate 102. In particular, the package substrate 102 may include conductive contacts 139 at its bottom surface 170-1, and the circuit board 134 may include conductive contacts 135 at its top surface; the SLI 137 may electrically and mechanically couple the conductive contacts 135 and the conductive contacts 139. The SLI 137 illustrated in FIG. 1A are solder balls (e.g., for a ball grid array arrangement), but any suitable SLIs 137 may be used (e.g., pins in a pin grid array arrangement or lands in a land grid array arrangement). The circuit board 134 may be a motherboard, for example, and may have other components attached to it (not shown). The circuit board 134 may include conductive pathways and other conductive contacts (not shown) for routing power, ground, and signals through the circuit board 134, as known in the art. In some embodiments, the second-level interconnects 137 may not couple the package substrate 102 to a circuit board 134, but may instead couple the package substrate 102 to another IC package, an interposer, or any other suitable component.

A number of elements are illustrated in FIG. 1A, but a number of these elements may not be present in microelectronic assemblies disclosed herein. For example, in various embodiments, the second-level interconnects 137, and/or the circuit board 134 may not be included. Further, FIG. 1A illustrates a number of elements that are omitted from subsequent drawings for ease of illustration, but may be included in any of the microelectronic assemblies disclosed herein. Examples of such elements include the die 114, the FLI 138, the SLI 137, and/or the circuit board 134. Many of the elements of the microelectronic assembly 100A of FIG. 1A are included in other ones of the accompanying figures; the discussion of these elements is not repeated when discussing these figures, and any of these elements may take any of the forms disclosed herein. A number of elements are not illustrated in FIG. 1A, but may be present in microelectronic subassemblies disclosed herein, for example, additional active components, such as additional dies, or additional passive components, such as surface-mount resistors, capacitors, and/or inductors, may be disposed on the top surface or the bottom surface of the package substrate 102, or embedded in the package substrate 102, and may be electrically connected by the conductive pathways in the package substrate, including via PTH 156.

Figure 1B:
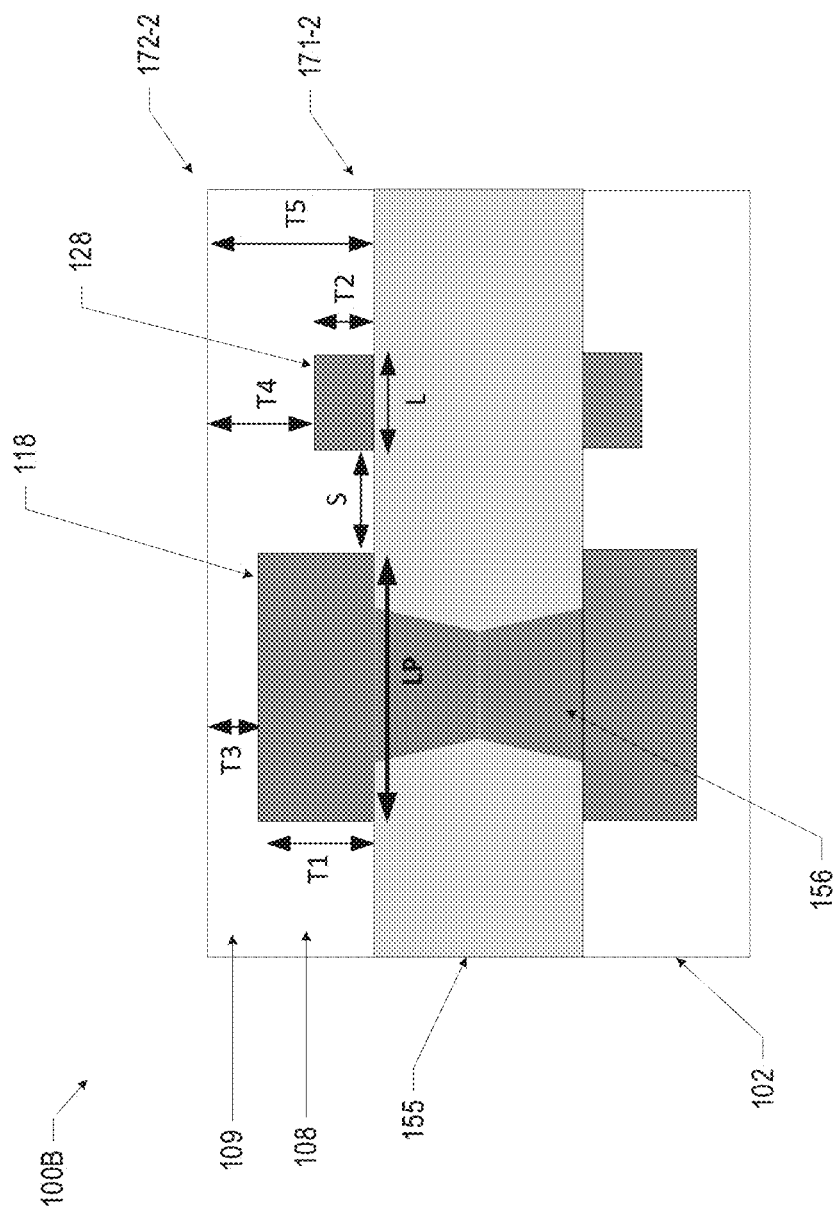
FIG. 1B is a side, cross-sectional, magnified view of a portion of the substrate of FIG. 1A, in accordance with various embodiments.

FIG. 1B is a cross-sectional, magnified view of a portion of a substrate of a microelectronic assembly, in accordance with various embodiments. The microelectronic assembly 100B may include a package substrate 102 having a core 155 with a PTH 156. In some embodiments, the core 155 may have a thickness between 50 um and 250 um. In some embodiments, the core 155 may have a thickness between 50 um and 150 um. In some embodiments, the core 155 may have a thickness between 60 um and 180 um. In some embodiments, the core 155 may have a thickness between 150 um and 250 um.

Package substrate 102 may include a conductive layer 108 on the core 155 having a first conductive feature 118 with a first thickness (T1) and a second conductive feature 128 with a second thickness (T2), where T1 is different than T2. For example, as shown in FIG. 1A, T1 may be greater than T2. In some embodiments, T1 may be twice T2. In some embodiments, T1 may be greater than twice T2. In some embodiments, T1 may be less than twice T2. In some embodiments, T1 may be between 10 um and 30 um. In some embodiments, T1 may be between 10 um and 20 um. In some embodiments, T1 may be between 15 um and 25 um. In some embodiments, T2 may be between 15 um and 35 um. In some embodiments, T2 may be between 20 um and 30 um. In some embodiments, T2 may be between 25 um and 35 um.

Package substrate 102 may also include a dielectric layer 109 on the conductive layer 108, where the dielectric layer may have different thicknesses relative to the different conductive feature thicknesses. For example, the dielectric layer 109 may have a third thickness (T3) over the first conductive feature 118, a fourth thickness (T4) over the second conductive feature 128, and a fifth thickness (T5) when measured from the top side 171-2 of the core 155 to the top surface 172-2 of the dielectric layer 109. In some embodiments, the fourth thickness may be greater than the third thickness. In some embodiments, T3 may be between 10 um and 30 um. In some embodiments, T3 may be between 10 um and 20 um. In some embodiments, T4 may be between 10 um and 20 um. In some embodiments, T4 may be between 10 um and 15 um. In some embodiments, T5 may be between 30 um and 50 um. In some embodiments, T5 may be between 35 um and 45 um.

As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, a higher density medium (e.g., the die 114) may have a line or space pitch of approximately 10 microns, while a lower density medium (e.g., the package substrate 102) may have a line or space pitch of approximately 40-50 microns. In another example, a higher density medium may have a line or space pitch of less than 20 microns, while a lower density medium may have a line or space pitch greater than 40 microns. A higher density medium may be manufactured using a modified semi-additive process or a semi-additive build-up process with advanced lithography (with small vertical interconnect features formed by advanced laser or lithography processes), while a lower density medium may be a printed circuit board (PCB) (e.g., circuit board 134) manufactured using a standard PCB process (e.g., a standard subtractive process using etch chemistry to remove areas of unwanted copper, and with coarse vertical interconnect features formed by a standard laser process).

As shown in FIG. 1B, microelectronic assembly 100B may have a line pitch (L) and a space pitch (S). In some embodiments, L may be between 10 um and 50 um. In some embodiments, L may be between 10 um and 20 um. In some embodiments, L may be between 15 um and 25 um. In some embodiments, L may be between 25 um and 35 um. In some embodiments, S may be between 10 um and 50 um. In some embodiments, S may be between 10 um and 20 um. In some embodiments, S may be between 15 um and 25 um. In some embodiments, S may be between 25 um and 35 um. In some embodiments, L and S may have the same dimensions. In some embodiments, L and S may have different dimensions. As shown in FIG. 1B, conductive features 118, 128 may have any suitable lengths and may have different lengths. For example, as shown in FIG. 1B, conductive feature 118 may be a PTH pad and conductive feature 128 may be a trace, where conductive feature 128 may have a length L and conductive feature 118 may have a length LP where LP is greater than L. In some embodiments, conductive feature 128 may have a length (L) between 20 um and 80 um. In some embodiments, conductive feature 128 may have a length (L) between 15 um and 30 um. In some embodiments, conductive feature 118 may have a length (LP) between 50 um and 250 um. In some embodiments, conductive feature 118 may have a length (LP) between 150 um and 200 um.

Although FIG. 1B shows only two conductive features, a microelectronic assembly may include any number of conductive features in the conductive layer 108, including more than two conductive features and the more than two conductive features may have any suitable thickness including a thickness equal to T1 or T2, or a thickness that is different than T1 or T2. Likewise, a microelectronic assembly may include a dielectric layer 109 with any number of thicknesses depending on the relative thicknesses of the two or more conductive features.

Any suitable techniques may be used to manufacture the microelectronic assemblies disclosed herein. For example, FIGS. 2A-2I are side, cross-sectional views of various stages in an example process for manufacturing a microelectronic assembly, in accordance with various embodiments. Although the operations discussed below with FIGS. 2A-2I (and others of the accompanying drawings representing manufacturing processes) are illustrated in a particular order, these operations may be performed in any suitable order. Additionally, although particular assemblies are illustrated in FIGS. 2A-2I (and others of the accompanying drawings representing manufacturing processes), the operations discussed below with reference to FIGS. 2A-2I may be used to form any suitable assemblies.

Figure 2A:
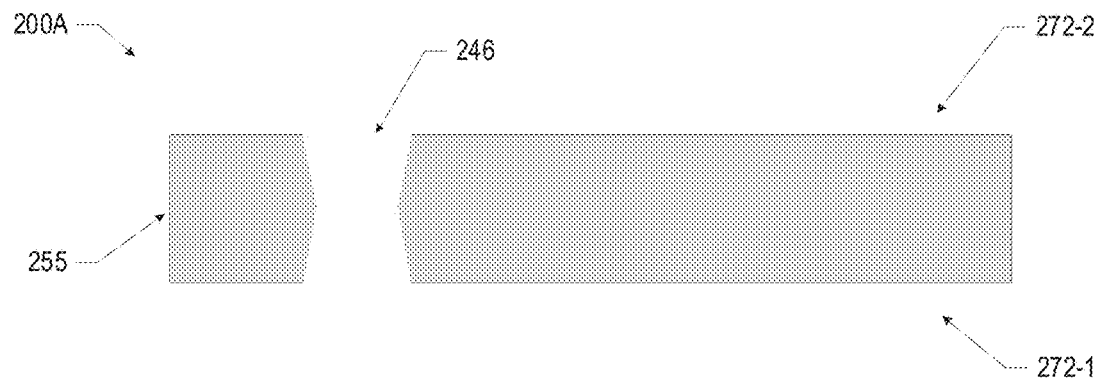
FIGS. 2A-2J are side, cross-sectional views of various stages in an example process for manufacturing a microelectronic assembly, in accordance with various embodiments.

FIG. 2A illustrates an assembly 200A including a core 255 subsequent to forming an opening 246 (e.g., a hole) through the core 255. The core 255 may be made of any suitable material as described above with reference to FIG. 1. In some embodiments, the core 255 may have a metal foil layer (not shown) plated on the top surface 272-2 and bottom surface 272-1 of the core (e.g., copper clad core). The foil layer may be any suitable conductive material, including copper. In some embodiments, the core 255 may provide mechanical stability to the package substrate as well as during manufacturing. The opening 246 may be made using any suitable technique, such as laser drilling, or may be formed during manufacture of the core 255. In some embodiments, the core 255 may have a thickness between 150 um and 250 um.

Figure 2B:
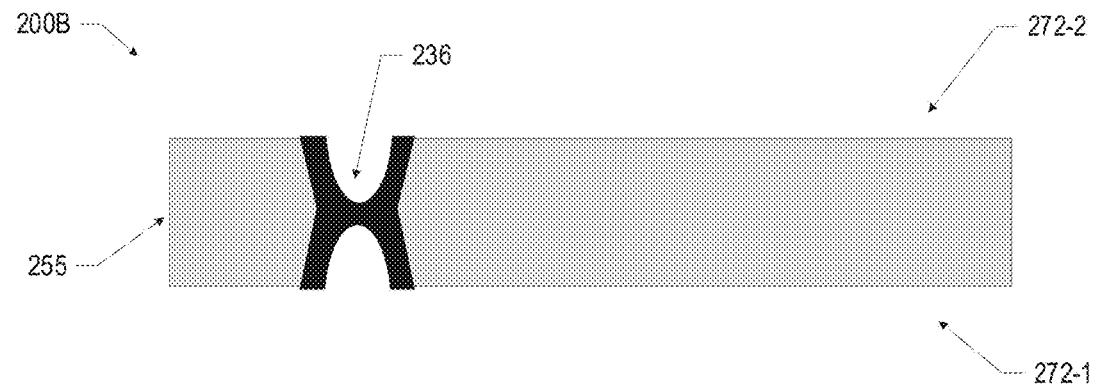

FIG. 2B illustrates an assembly 200B subsequent to forming a conductive bridge 236 in opening 246. In some embodiments, subsequent to drilling the opening 246, the surface of the opening may be recessed by a flash etching process, a wet etch process, or a dry etch process. Any residue remaining in the opening 246 may be cleaned away using any suitable process, such as a wet desmear process. A conductive bridge 236 may be formed by depositing conductive material in the opening 246 using any suitable technique, including, for example, electroplating, sputtering, or electroless plating. In some embodiments, a thickness of the conductive material may be between 4 um and 10 um. In some embodiments, a seed layer (not shown) may be deposited on the top surface 272-2 and bottom surface 272-1 of the core 255 prior to depositing the conductive material to form the conductive bridge 236. The seed layer may be any suitable conductive material, including copper.

Figure 2C:
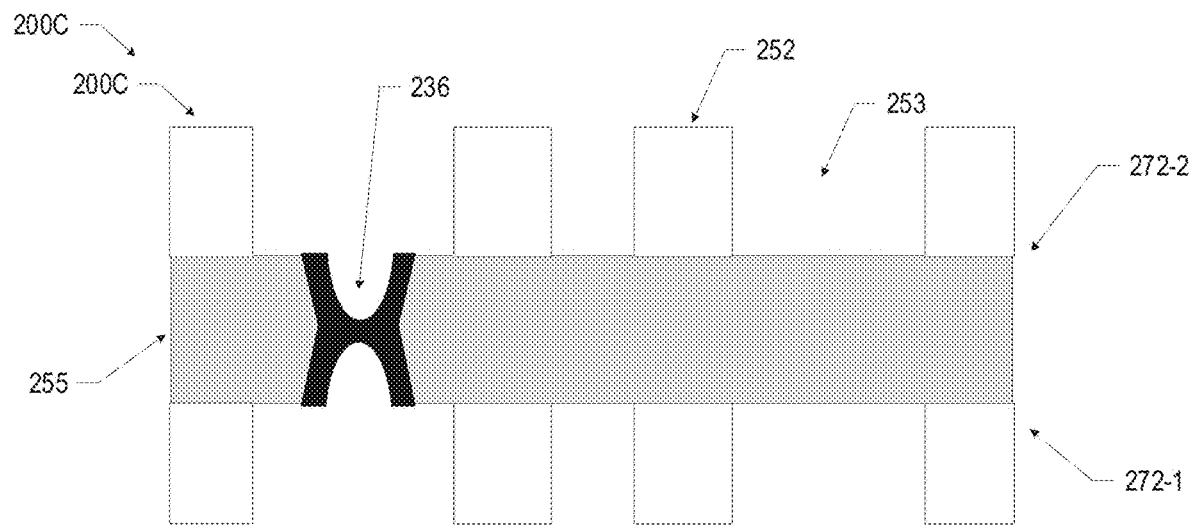

FIG. 2C illustrates an assembly 200C subsequent to depositing a first photoresist material 252 on the top surface 272-2 and bottom surface 272-1 of the core 255, and to patterning the first photoresist material to provide openings 253 for the formation of conductive features, (e.g., conductive traces or conductive pads). The first photoresist material 252 may be any suitable material, such as dry film resist (DFR), and may be patterned using any suitable technique, including a lithographic process (e.g., exposing the first photoresist material to a radiation source through a mask and developing with a developer). For example, the first photoresist material 252 may be deposited using lamination and may be positively or negatively charged to create crosslinked and non-crosslinked portions using ultraviolet for patterning conductive material layer. The non-crosslinked portions dissolve to form openings 253 where conductive material may be deposited. The openings 253 may have any suitable size and shape for forming a conductive feature having desired characteristics. For example, opening 253 may shaped to form a conductive trace having a particular size and shape.

In some embodiments, a dielectric material (not shown) may be deposited in the conductive bridge 236, then removed, for example, by mechanical, chemical, or plasma etchback, to be continuous with the top surface 272-2 and bottom surface 272-1 of the core 255.

Figure 2D:
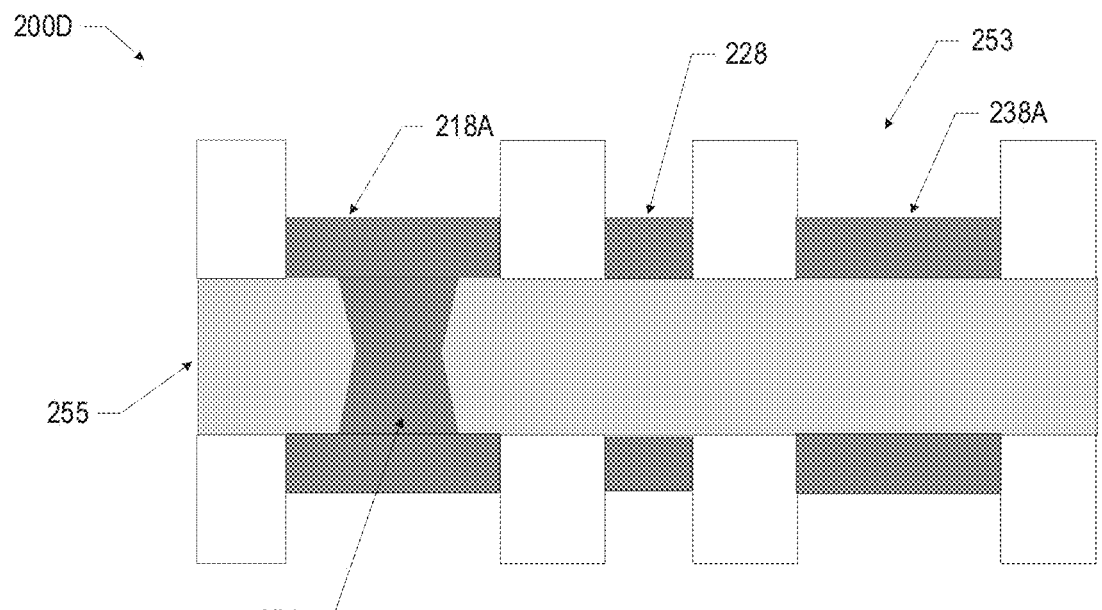

FIG. 2D illustrates an assembly 200D subsequent to depositing a first conductive layer or material in the openings 253 for the formation of conductive features, including conductive features 218A, 228, 238A. The conductive features may be formed from any suitable conductive material, for example, copper (Cu), aluminum (Al), gold (Au), silver (Ag), and/or alloys thereof. The first conductive layer may have any suitable thickness (e.g., in some embodiments, a thickness between 10 um and 30 um). The conductive features may include conductive pads and/or traces, for example, conductive feature 218A may include a conductive pad for the PTH 256 or may include a trace electrically coupled to a power plane or a ground plane (not shown).

Figure 2E:
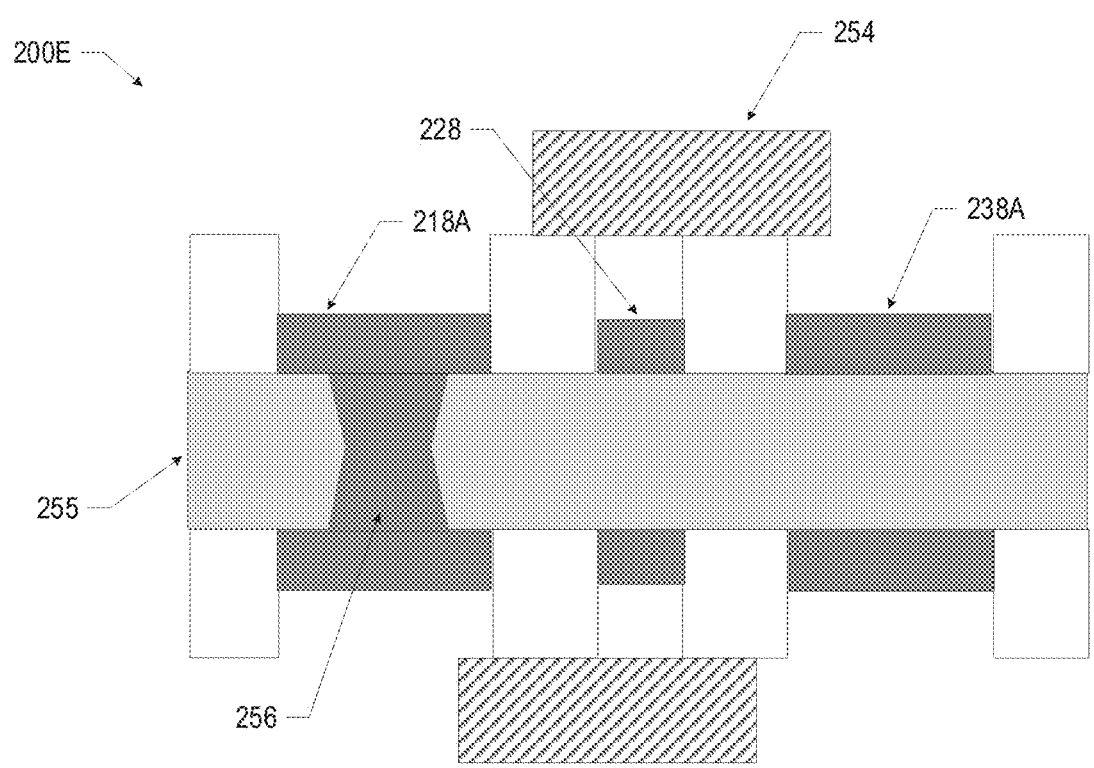

FIG. 2E illustrates an assembly 200E subsequent to depositing a second photoresist material 254 on the first photoresist material 252 and patterning the second photoresist material 254 to mask or cover a particular region, such as a conductive feature 228. The second photoresist material 254 may act as a barrier to prevent additional conductive material from being deposited on the conductive feature 228. As described above with reference to FIG. 2C, the second photoresist material 254 may be any suitable material, such as DFR, and may be patterned using any suitable technique, including a lithographic process.

Figure 2F:
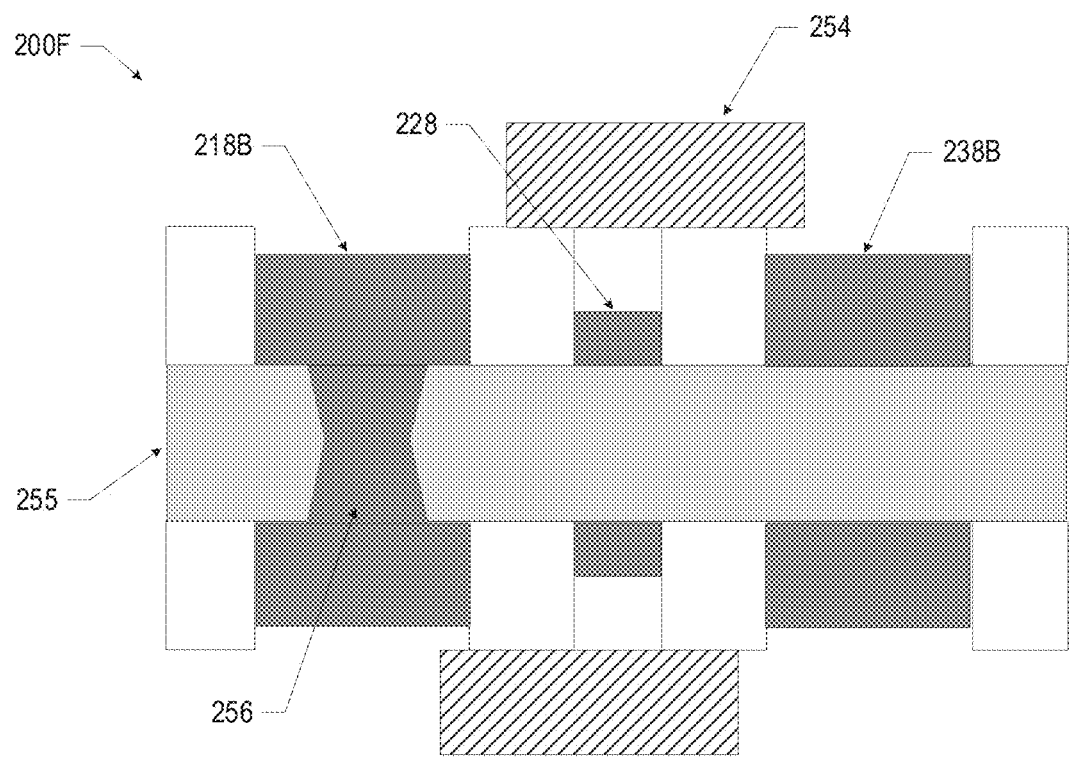

FIG. 2F an assembly 200F subsequent to depositing a second conductive layer or material in the openings 253 for the formation of thicker conductive features 218B, 238B. The second photoresist material 254 may prevent the second conductive layer from being deposited on conductive feature 228, so that conductive feature 228 may have a smaller thickness as compared to conductive features 218B, 238B. Conductive features having a greater thickness than conductive features 218B, 238B may be formed by repeating the process described in FIG. 2E-2F to add additional photoresist layers and additional conductive layers. For example, a third photoresist layer (not shown) may be deposited and patterned to cover conductive feature 238B, and a third conductive layer (not shown) may be deposited on conductive feature 218B to form a thicker conductive feature as compared to 228, 238B.

Figure 2G:
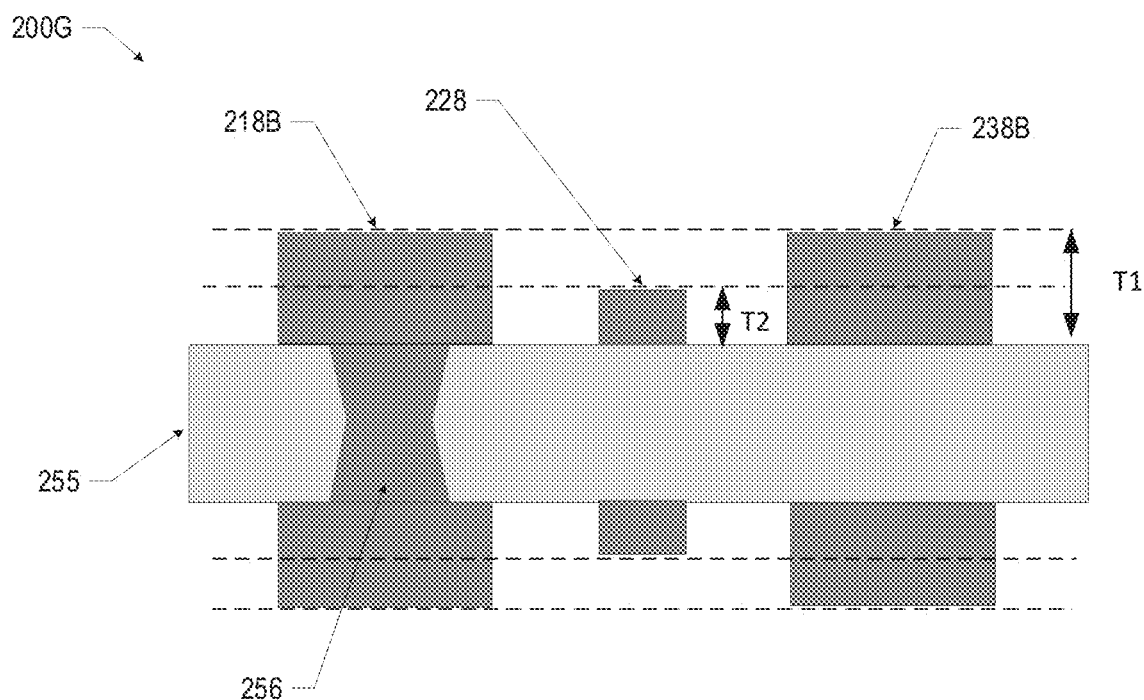

FIG. 2G illustrates an assembly 200G subsequent to stripping the first and second photoresist materials 252, 254 to expose the conductive features 218B, 228, 238B. Although FIG. 2G shows particular conductive features 218B, 228, 238B, the conductive features may take any form, including a conductive plane, or a conductive via.

Figure 2H:
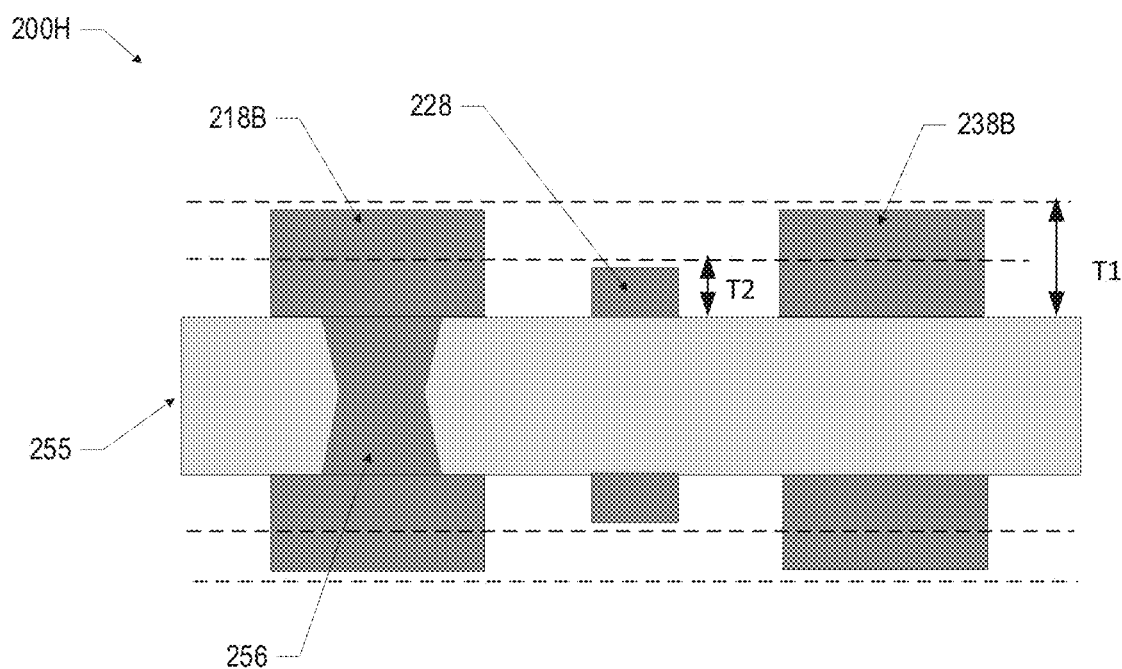

FIG. 2H illustrates an assembly 200H subsequent to etching the exposed top surface of the conductive features 218B, 228, 238B. In some embodiments, the top surfaces of the conductive features may be recessed with a flash etching process, a wet etch or a dry etch process. In some embodiments, when a seed layer is deposited, the exposed portions of the seed layer may be removed using any suitable process, including chemical etching, among others.

Figure 2I:
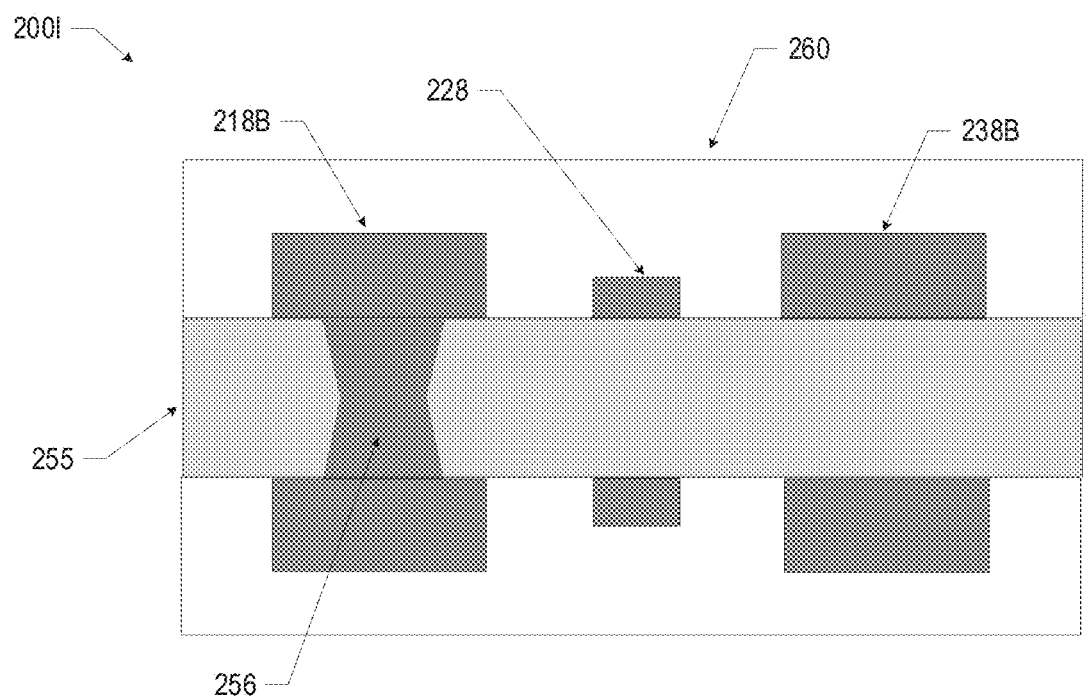

FIG. 2I illustrates an assembly 200I subsequent to forming a dielectric layer 260 over a top surface and bottom surface of assembly 200H, including the conductive features 218B, 228, 238B. The dielectric layer 260 may be formed using any suitable process, including lamination, or slit coating and curing. The dielectric layer 260 may be formed to completely cover the conductive features 218B, 228, 238B, such that the thickness of the deposited dielectric layer 260 is greater than the thickness of the conductive features 218B, 228, 238B. In some embodiments, the dielectric layer 260 may be planarized using any suitable technique, including grinding. In some embodiments, the dielectric layer 260 may be flattened by a press, such as a stainless steel press. In some embodiments, the dielectric layer 260 may be removed to expose the top surface of the conductive features 218B, 228, 238B using any suitable technique, including grinding, or etching, such as a wet etch, a dry etch (e.g., a plasma etch), a wet blast, or a laser ablation (e.g., using excimer laser). In some embodiments, the thickness of the dielectric layer 260 may be minimized to reduce the etching time required to expose the top surface of the conductive features 218B, 228, 2386.

Figure 2J:
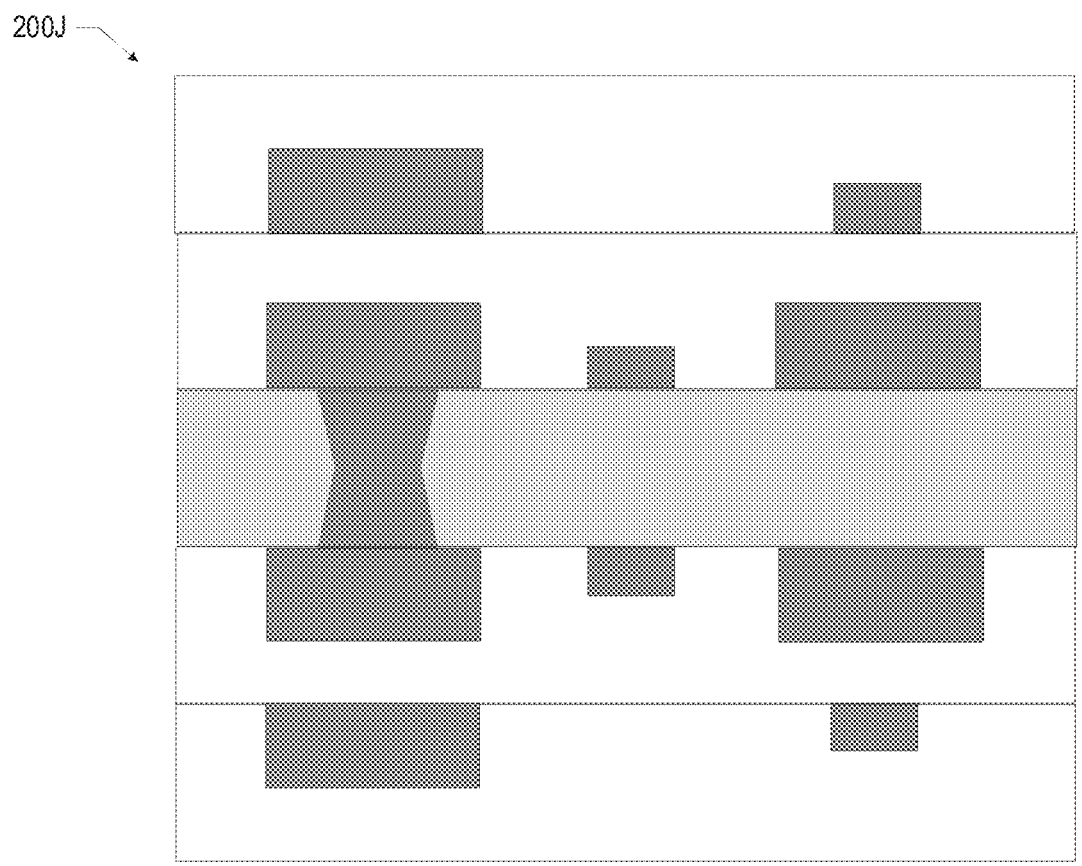

Additional layers may be built up in the package substrate by repeating the process as described with respect to FIGS. 2A-2I, or by any suitable process, which is known in the art, including a semi-additive process (SAP). FIG. 2J illustrates an assembly 200J subsequent to forming additional conductive and dielectric layers on assembly 200I. The finished substrate may be a single package substrate or may be a repeating unit that may undergo a singulation process in which each unit is separated for one another to create a single package substrate. Further operations may be performed as suitable (e.g., attaching dies to the package substrate, attaching solder balls for coupling to a circuit board, etc.).

Figure 3:
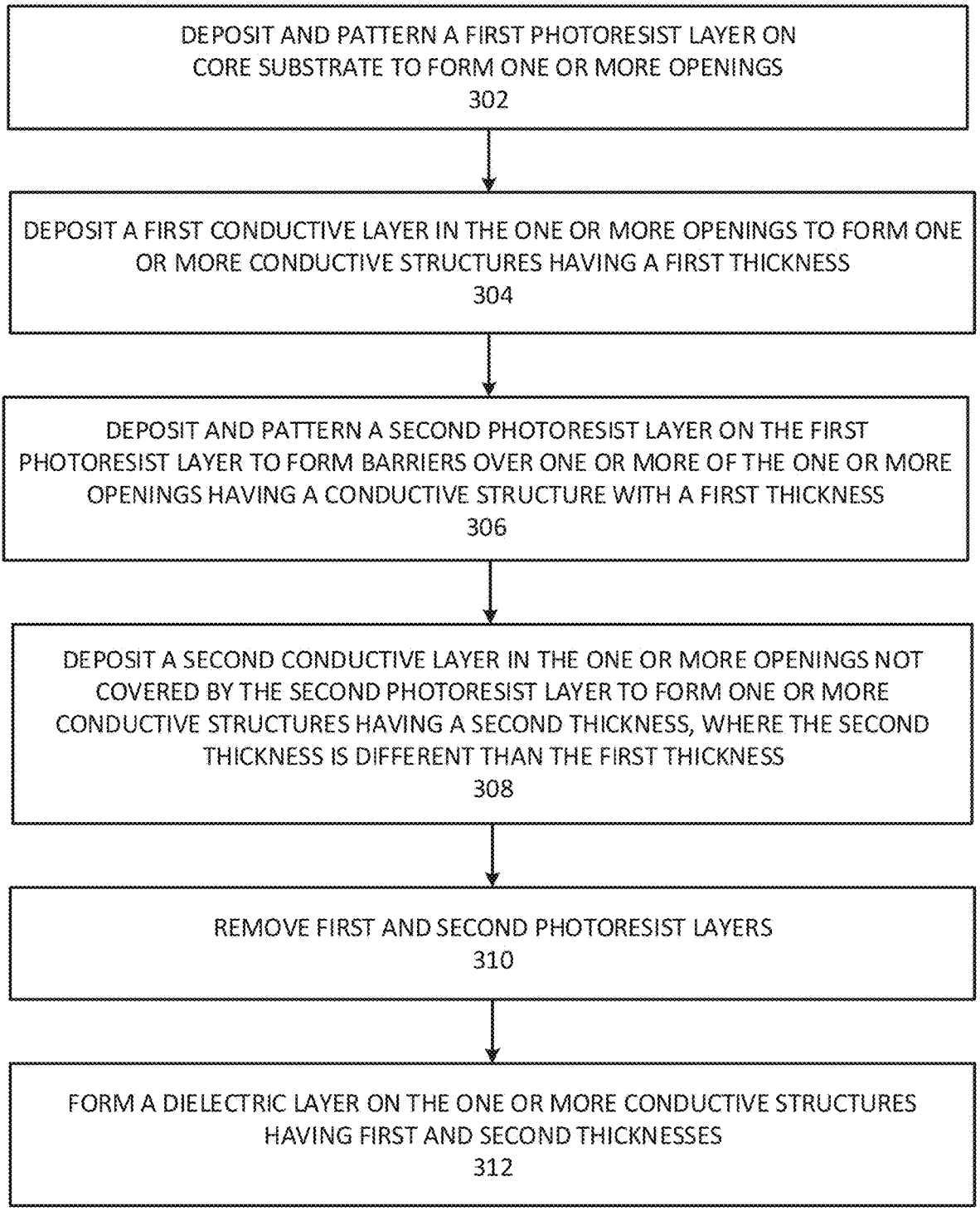
FIG. 3 is a process flow diagram of an example method of forming a microelectronic assembly, in accordance with various embodiments.

FIG. 3 is a process flow diagram of an example method of forming a microelectronic assembly including a core with a plurality of conductive structures having different thicknesses, in accordance with various embodiments. At 302, deposit and pattern a first photoresist layer on a core substrate to create one or more openings for forming conductive structures. At 304, deposit a first conductive material, such as copper, in the one or more openings to form one or more conductive structures having a first thickness. In some embodiments, a seed layer may be deposited before depositing the first conductive layer. Optionally, prior to forming a first photoresist layer, a PTH may be formed on the core substrate. The PTH may be formed by any suitable process, for example, by laser drilling, etching back, desmearing, and plating, such as electroless copper plating, to form a conductive bridge. In some embodiments, a dielectric material may be deposited in the PTH. In some embodiments, a conductive material may be deposited in the PTH, for example, when the first conductive layer is formed on the core substrate. At 306, deposit and pattern a second photoresist layer on the first photoresist layer to form a covering or a barrier over one or more of the openings having a conductive structure with a first thickness. At 308, deposit a second conductive layer, such as copper, in the one or more openings not covered by the second photoresist layer to form one or more conductive structures having a second thickness, where the second thickness is greater than the first thickness. At 310, remove the first and second photoresist layers to expose the conductive structures. A photoresist layer may be deposited, patterned by exposure to, for example, ultraviolet light, where non-masked regions for openings that correspond to the conductive structures. Conductive structures are formed by depositing conductive material, such as metal, in the openings by, for example, electrolytic plating. Conductive structures having a thickness greater than the second thickness may be formed by repeating the process as described in 306 through 308 to form any number of photoresist layers and conductive layers. At 312, form a dielectric layer on the conductive structures, where the conductive structures have different thicknesses (e.g., first and second thicknesses). Additional conductive layers having conductive structures with different thicknesses may be formed by repeating the process as described in 302 through 312, or by any suitable process, such as SAP. The finished substrate may be a single package substrate or may be a repeating unit that may undergo a singulation process in which each unit is separated for one another to create a single package substrate.

Figure 4A:
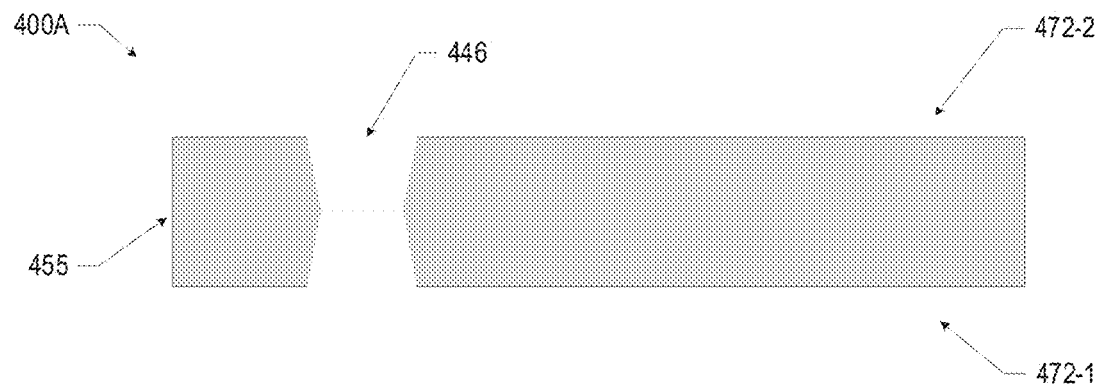
FIGS. 4A-4F are side, cross-sectional views of various stages in an example process for manufacturing a microelectronic assembly, in accordance with various embodiments.

FIG. 4A illustrates an assembly 400A including a core 255 subsequent to forming an opening 446 (e.g., a hole) through the core 455. The core 455 may be made of any suitable material as described above with reference to FIG. 1. In some embodiments, the core 455 may have a metal foil layer (not shown) plated on the top surface 472-2 and bottom surface 472-1 of the core (e.g., a copper clad core). The foil layer may be any suitable conductive material, including copper. In some embodiments, the core 455 may provide mechanical stability to the package substrate as well as during manufacturing. The opening 446 may be made using any suitable technique, such as laser drilling, or may be formed during manufacture of the core 455. In some embodiments, the core 455 may have a thickness between 60 um and 180 um. In some embodiments, the core 455 may have a thickness between 50 um and 150 um.

In some embodiments, the surface of the opening 446 may be recessed by a flash etching process, a wet etch process, or a dry etch process. Any residue remaining in the opening 446 may be cleaned away using any suitable process, such as a wet desmear process.

Figure 4B:
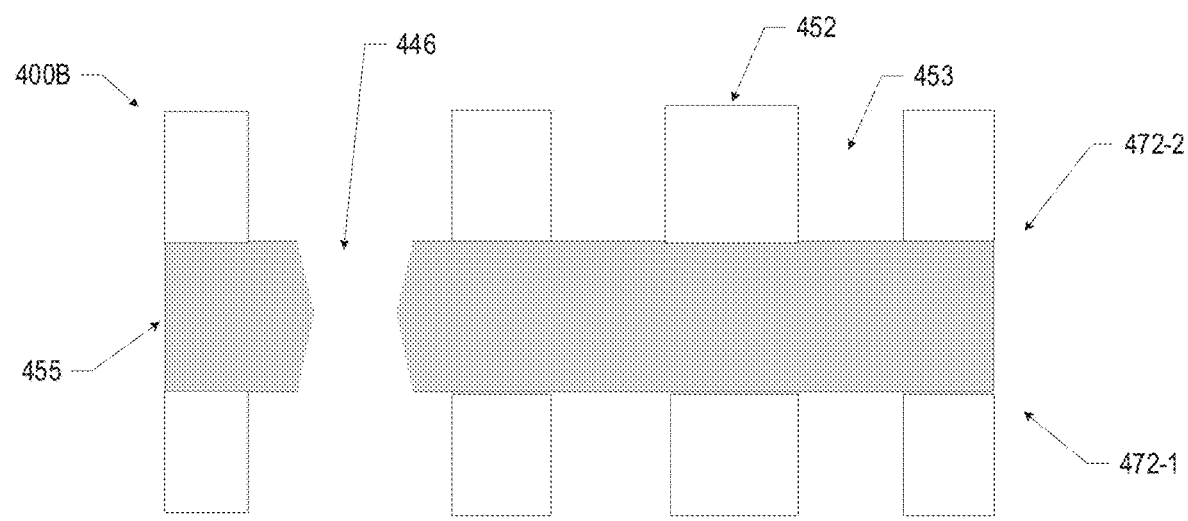

FIG. 4B illustrates an assembly 400B subsequent to depositing a first photoresist layer or material 452 on the top surface 472-2 and bottom surface 472-1 of the core 455, and to patterning the first photoresist material to provide one or more openings 453 for the formation of one or more conductive features, (e.g., traces, pads, or planes). The first photoresist material 452 may be any suitable material, such as DFR, and may be patterned using any suitable technique, including a lithographic process (e.g., exposing the first photoresist material to a radiation source through a mask and developing with a developer) as described above with reference to FIG. 2.

Figure 4C:
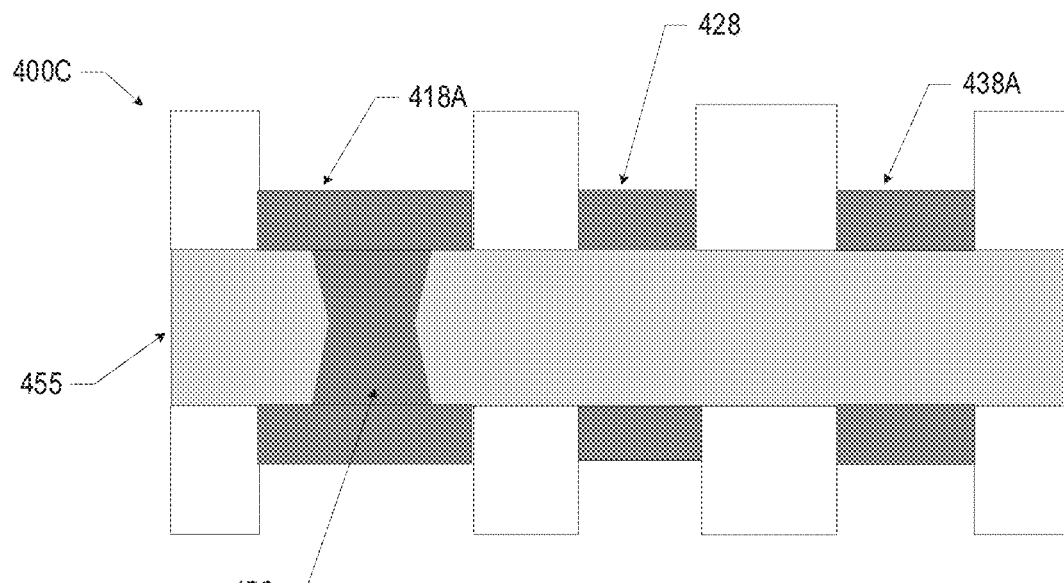

FIG. 4C illustrates an assembly 400C subsequent to depositing a first conductive layer or material in the openings 453 for the formation of conductive features, including conductive features 418A, 428, 438A, and in the opening 446 to form a PTH 456. The conductive features may be formed from any suitable conductive material, for example, copper (Cu), aluminum (Al), gold (Au), silver (Ag), and/or alloys thereof. The first conductive layer may have any suitable thickness (e.g., in some embodiments, a thickness between 15 um and 35 um). The conductive features may include conductive pads and/or traces, for example, conductive feature 418A may include a conductive pad for the PTH 456 or may include a trace electrically coupled to a power plane or a ground plane (not shown).

Figure 4D:
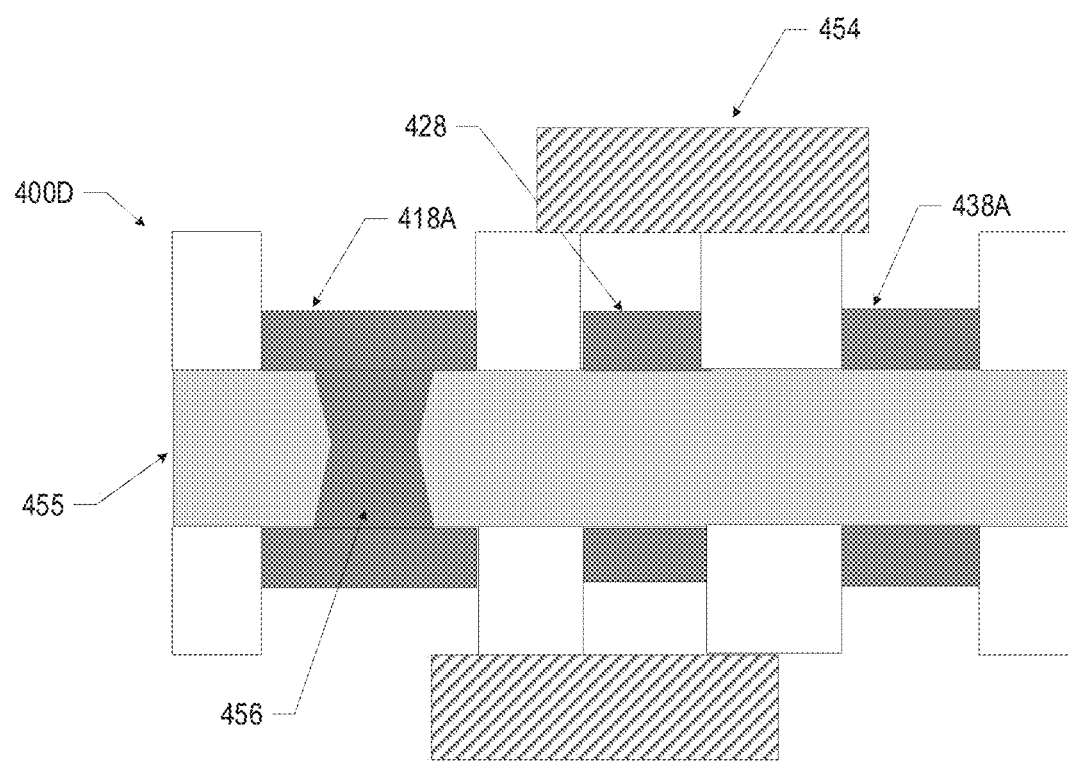

FIG. 4D illustrates an assembly 400D subsequent to depositing a second photoresist layer or material 454 on the first photoresist material 452 and patterning the second photoresist material 454 to mask or cover a particular region, such as a conductive feature 428. The second photoresist material 454 may act as a barrier to prevent additional conductive material from being deposited on the conductive feature 228. As described above with reference to FIG. 2, the second photoresist material 454 may be any suitable material, such as DFR, and may be patterned using any suitable technique, including a lithographic process.

Figure 4E:
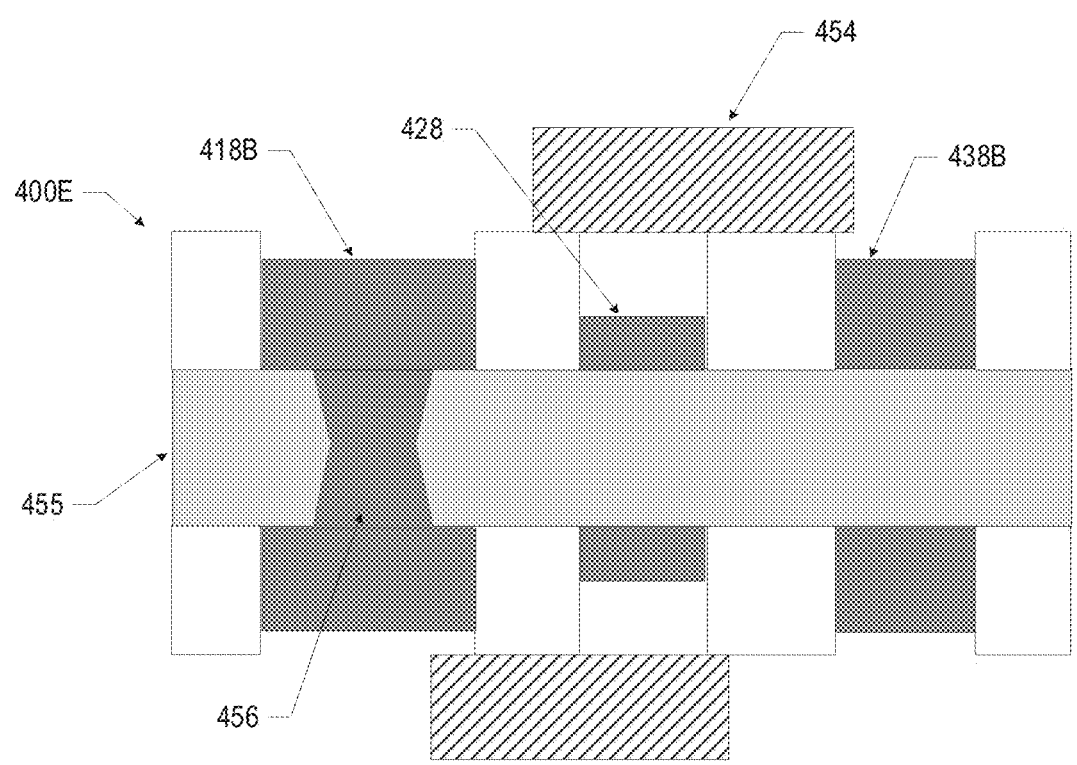

FIG. 4E illustrates an assembly 400E subsequent to depositing a second conductive layer or material in the openings for the formation of thicker conductive features 418B, 438B. The second photoresist material 454 may prevent the second conductive layer from being deposited on conductive feature 428, so that conductive feature 428 may have a first thickness and conductive features 418B, 438B, where the second thickness is thicker than the first thickness. Additional conductive features having a greater thickness than conductive features 418B, 438B may be formed by repeating the process described in FIG. 4D-4E. For example, a third photoresist layer (not shown) may be deposited and patterned to cover conductive feature 438B, and a third conductive layer may be deposited on conductive feature 418B to form a thicker conductive feature as compared to 428, 438B.

Figure 4F:
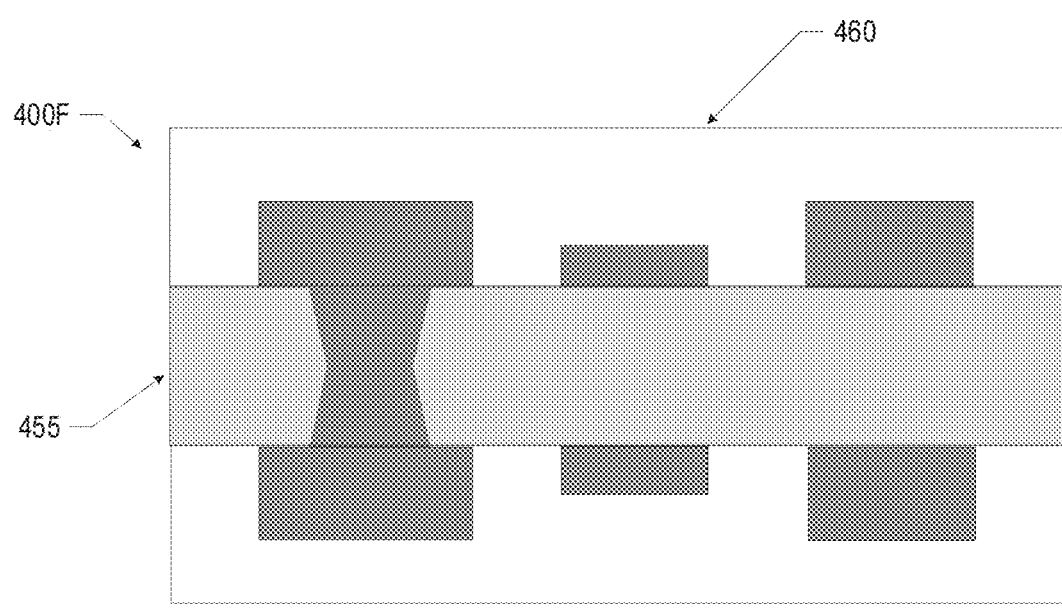

FIG. 4F illustrates an assembly 400F subsequent to stripping the first and second photoresist materials 452, 454 to expose the conductive features 418B, 428, 438B, etching the exposed top surface of the conductive features 418B, 428, 438B, and forming a dielectric layer 460 on the conductive features 418B, 428, 438B. These processes may be any suitable processes as described above with reference to FIG. 2. Although FIG. 4F shows particular conductive features, the conductive features may take any suitable form.

Additional layers may be built up in the package substrate by repeating the process as described with respect to FIGS. 4A-4F, or by any suitable process, which is known in the art, including a SAP. The finished substrate may be a single package substrate or may be a repeating unit that may undergo a singulation process in which each unit is separated for one another to create a single package substrate. Further operations may be performed as suitable (e.g., attaching dies to the package substrate, attaching solder balls for coupling to a circuit board, etc.).

Figure 5:
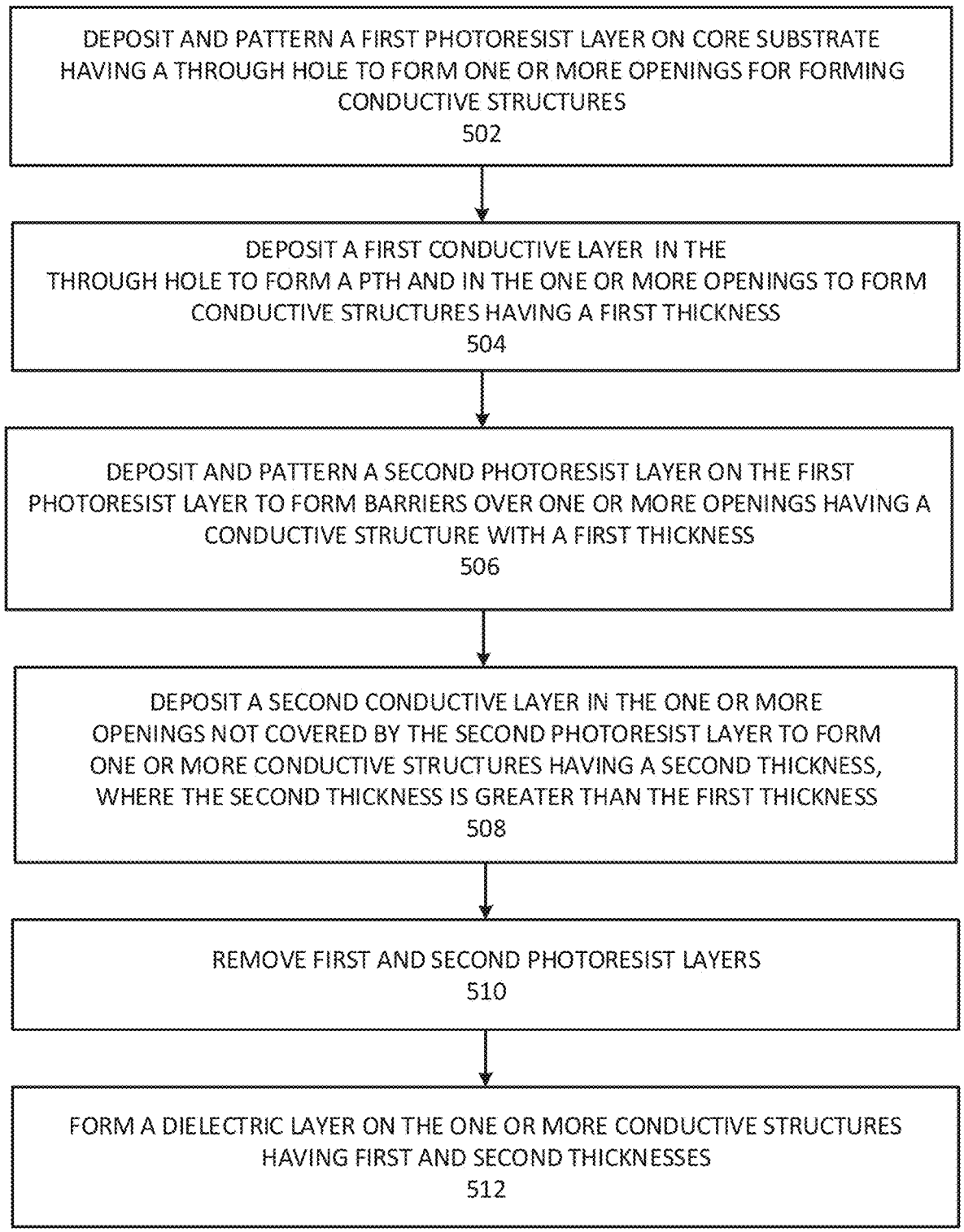
FIG. 5 is a process flow diagram of an example method of forming a microelectronic assembly, in accordance with various embodiments.

FIG. 5 is a process flow diagram of an example method of forming a microelectronic assembly including a core with a plurality of conductive structures having different thicknesses, in accordance with various embodiments. At 502, deposit and pattern a first photoresist layer on a core substrate having a through hole to create one or more openings for forming conductive structures. At 504, deposit a first conductive material, such as copper, in the through hole to form a PTH and in the one or more openings to form one or more conductive structures having a first thickness. In some embodiments, a seed layer may be deposited before depositing the first conductive layer. At 506, deposit and pattern a second photoresist layer on the first photoresist layer to form a covering or a barrier over one or more openings having a conductive structure with a first thickness. At 508, deposit a second conductive layer, such as copper, in the one or more openings not covered by the second photoresist layer to form one or more conductive structures having a second thickness, where the second thickness is greater than the first thickness. At 510, remove the first and second photoresist layers to expose the conductive structures. Conductive structures having a thickness greater than the second thickness may be formed by repeating the process as described in 506 through 508 to form any number of photoresist layers and conductive layers. At 512, form a dielectric layer on the one or more conductive structures, where the conductive structures have first and second thicknesses. Additional conductive layers having conductive structures with different thicknesses may be formed by repeating the process as described in 502 through 512, or by any suitable process, such as SAP. The finished substrate may be a single package substrate or may be a repeating unit that may undergo a singulation process in which each unit is separated for one another to create a single package substrate.

The microelectronic assemblies disclosed herein may be used for any suitable application. For example, in some embodiments, a microelectronic assembly may include a die that may be used to provide an ultra-high density and high bandwidth interconnect for field programmable gate array (FPGA) transceivers and III-V amplifiers. In an example, a microelectronic assembly may include a die that may be a processing device (e.g., a CPU, a radio frequency chip, a power converter, a network processor, a GPU, a FPGA, a modem, an applications processor, etc.), and the die may include high bandwidth memory, transceiver circuitry, and/or input/output circuitry (e.g., Double Data Rate transfer circuitry, Peripheral Component Interconnect Express circuitry, etc.).

In another example, a microelectronic assembly may include a die that may be a cache memory (e.g., a third level cache memory), and one or more dies that may be processing devices (e.g., a CPU, a radio frequency chip, a power converter, a network processor, a GPU, a FPGA, a modem, an applications processor, etc.) that share the cache memory of the die.

Figure 6:
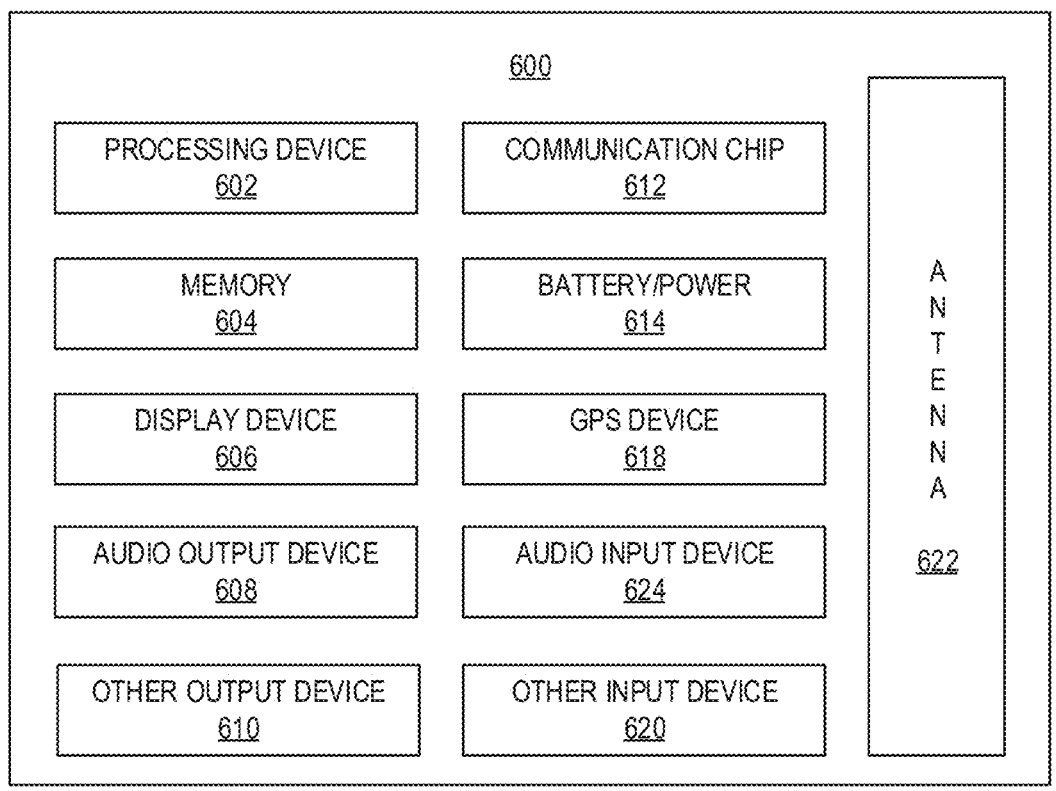
FIG. 6 is a block diagram of an example electrical device that may include a microelectronic assembly, in accordance with any of the embodiments disclosed herein.

The microelectronic assemblies disclosed herein may be included in any suitable electronic component. FIG. 6 is a block diagram of an example electrical device 600 that may include one or more of the microelectronic assemblies disclosed herein. For example, any suitable ones of the components of the electrical device 600 may be arranged in any of the microelectronic assemblies disclosed herein. A number of components are illustrated in FIG. 6 as included in the electrical device 600, but any one or more of these components may be omitted or duplicated, as suitable for the application. In some embodiments, some or all of the components included in the electrical device 600 may be attached to one or more motherboards. In some embodiments, some or all of these components are fabricated onto a single system-on-a-chip (SoC) die.

Additionally, in various embodiments, the electrical device 600 may not include one or more of the components illustrated in FIG. 6, but the electrical device 600 may include interface circuitry for coupling to the one or more components. For example, the electrical device 600 may not include a display device 606, but may include display device interface circuitry (e.g., a connector and driver circuitry) to which a display device 606 may be coupled. In another set of examples, the electrical device 600 may not include an audio input device 624 or an audio output device 608, but may include audio input or output device interface circuitry (e.g., connectors and supporting circuitry) to which an audio input device 624 or audio output device 608 may be coupled.

The electrical device 600 may include a processing device 602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 602 may include one or more digital signal processors (DSPs), application-specific integrated circuits (ASICs), CPUs, GPUs, cryptoprocessors (specialized processors that execute cryptographic algorithms within hardware), server processors, or any other suitable processing devices. The electrical device 600 may include a memory 604, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 604 may include memory that shares a die with the processing device 602. This memory may be used as cache memory and may include embedded dynamic random access memory (eDRAM) or spin transfer torque magnetic random access memory (STT-M RAM).

In some embodiments, the electrical device 600 may include a communication chip 612 (e.g., one or more communication chips). For example, the communication chip 612 may be configured for managing wireless communications for the transfer of data to and from the electrical device 600. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 612 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 612 may operate in accordance with other wireless protocols in other embodiments. The electrical device 600 may include an antenna 622 to facilitate wireless communications and/or to receive other wireless communications (such as AM or FM radio transmissions).

In some embodiments, the communication chip 612 may manage wired communications, such as electrical, optical, or any other suitable communication protocols (e.g., the Ethernet). As noted above, the communication chip 612 may include multiple communication chips. For instance, a first communication chip 612 may be dedicated to shorter-range wireless communications such as Wi-Fi or Bluetooth, and a second communication chip 612 may be dedicated to longer-range wireless communications such as global positioning system (GPS), EDGE, GPRS, CDMA, WiMAX, LTE, EV-DO, or others. In some embodiments, a first communication chip 612 may be dedicated to wireless communications, and a second communication chip 612 may be dedicated to wired communications.

The electrical device 600 may include battery/power circuitry 614. The battery/power circuitry 614 may include one or more energy storage devices (e.g., batteries or capacitors) and/or circuitry for coupling components of the electrical device 600 to an energy source separate from the electrical device 600 (e.g., AC line power).

The electrical device 600 may include a display device 606 (or corresponding interface circuitry, as discussed above). The display device 606 may include any visual indicators, such as a heads-up display, a computer monitor, a projector, a touchscreen display, a liquid crystal display (LCD), a light-emitting diode display, or a flat panel display.

The electrical device 600 may include an audio output device 608 (or corresponding interface circuitry, as discussed above). The audio output device 608 may include any device that generates an audible indicator, such as speakers, headsets, or earbuds.

The electrical device 600 may include an audio input device 624 (or corresponding interface circuitry, as discussed above). The audio input device 624 may include any device that generates a signal representative of a sound, such as microphones, microphone arrays, or digital instruments (e.g., instruments having a musical instrument digital interface (MIDI) output).

The electrical device 600 may include a GPS device 618 (or corresponding interface circuitry, as discussed above). The GPS device 618 may be in communication with a satellite-based system and may receive a location of the electrical device 600, as known in the art.

The electrical device 600 may include another output device 610 (or corresponding interface circuitry, as discussed above). Examples of the other output device 610 may include an audio codec, a video codec, a printer, a wired or wireless transmitter for providing information to other devices, or an additional storage device.

The electrical device 600 may include another input device 620 (or corresponding interface circuitry, as discussed above). Examples of the other input device 620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 600 may have any desired form factor, such as a portable, hand-held, or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 600 may be any other electronic device that processes data.

The following paragraphs provide various examples of the embodiments disclosed herein.

Example 1 is a microelectronic assembly, including: a package substrate including a core having a surface; a first conductive feature having a first thickness on the surface of the core; and a second conductive feature having a second thickness on the surface of the core, wherein the second thickness is different than the first thickness.

Example 2 may include the subject matter of Example 1, and may further specify that the second thickness is greater than the first thickness.

Example 3 may include the subject matter of Example 1, and may further specify that the core has a thickness between 50 um and 150 um.

Example 4 may include the subject matter of Example 1, and may further specify that the core has a thickness between 60 um and 180 um.

Example 5 may include the subject matter of Example 1, and may further specify that the core has a thickness between 150 um and 250 um.

Example 6 may include the subject matter of Example 1, and may further specify that the first thickness is between 10 um and 30 um.

Example 7 may include the subject matter of Example 1, and may further specify that the second thickness is between 15 um and 35 um.

Example 8 may include the subject matter of Example 1, and may further include: a plated through hole in the core.

Example 9 may include the subject matter of Example 1, and may further specify that the first conductive feature is electrically coupled to an electrical signal.

Example 10 may include the subject matter of Example 1, and may further specify that the second conductive feature is electrically coupled to a power plane or a ground plane.

Example 11 may include the subject matter of Example 1, and may further include: a die electrically coupled to the package substrate.

Example 12 may include the subject matter of Example 11, and may further specify that the die is a central processing unit, a radio frequency chip, a power converter, or a network processor.

Example 13 may include the subject matter of any of Examples 1-12, and may further specify that the microelectronic assembly is included in a server device.

Example 14 may include the subject matter of any of Examples 1-12, and may further specify that the microelectronic assembly is included in a portable computing device.

Example 15 may include the subject matter of any of Examples 1-12, and may further specify that the microelectronic assembly included in a wearable computing device.

Example 16 is a microelectronic assembly, including: a package substrate, the package substrate including: a core having a surface; a first trace having a first thickness on the surface of the core; and a second trace having a second thickness on the surface of the core, wherein the second thickness is different than the first thickness; and a die coupled to the package substrate and electrically coupled to the first trace via conductive pathways in the package substrate.

Example 17 may include the subject matter of Example 16, and may further specify that the second thickness is greater than the first thickness.

Example 18 may include the subject matter of Example 16, and may further specify that the core has a thickness between 50 um and 150 um.

Example 19 may include the subject matter of Example 16, and may further specify that the core has a thickness between 60 um and 180 um.

Example 20 may include the subject matter of Example 16, and may further specify that the core has a thickness between 150 um and 250 um.

Example 21 may include the subject matter of Example 16, and may further specify that the first thickness is between 10 um and 30 um.

Example 22 may include the subject matter of Example 16, and may further specify that the second thickness is between 15 um and 35 um.

Example 23 may include the subject matter of Example 16, and may further include: a plated through hole in the core.

Example 24 may include the subject matter of Example 16, and may further specify that the first trace is electrically coupled to an electrical signal.

Example 25 may include the subject matter of Example 16, and may further specify that the second trace is electrically coupled to a power plane or a ground plane.

Example 26 may include the subject matter of Example 16, and may further specify that the die is a central processing unit, a radio frequency chip, a power converter, or a network processor.

Example 27 may include the subject matter of any of Examples 16-26, and may further specify that the microelectronic assembly is included in a server device.

Example 28 may include the subject matter of any of Examples 16-26, and may further specify that the microelectronic assembly is included in a portable computing device.

Example 29 may include the subject matter of any of Examples 16-26, and may further specify that the microelectronic assembly included in a wearable computing device.

Example 30 is a method of manufacturing a microelectronic assembly, including: depositing and patterning a first photoresist layer on a core substrate to form one or more openings; forming a first conductive layer in the one or more openings to form one or more conductive features having a first thickness; depositing and patterning a second photoresist layer on the first photoresist layer to cover one or more of the one or more openings; and forming a second conductive layer in the one or more openings not covered by the second photoresist layer to form one or more conductive features having a second thickness, wherein the second thickness is different from the first thickness.

Example 31 may include the subject matter of Example 30, and may further specify that the second thickness is greater than the first thickness.

Example 32 may include the subject matter of Example 30, and may further specify that the one or more conductive features having a first thickness are traces to transmit or to receive a signal.

Example 33 may include the subject matter of Example 30, and may further specify that the one or more conductive features having a second thickness are traces to couple to a power plane or a ground plane.

Example 34 may include the subject matter of Example 30, and may further include: removing the first and second photoresist layers; and forming a dielectric layer on the one or more conductive features having first and second thicknesses.

Example 35 may include the subject matter of Example 30, and may further specify that forming the first conductive layer includes: depositing a seed layer on the core substrate layer before depositing the first photoresist layer.

Example 36 may include the subject matter of Example 30, and may further include: forming a plated through hole in the core substrate prior to depositing and patterning the first photoresist layer.

Example 37 may include the subject matter of Example 36, and may further specify that forming the plated through hole in the core substrate includes: laser drilling a through hole in the core substrate; and depositing conductive material in the through hole to fill the through hole.

Example 38 may include the subject matter of Example 36, and may further specify that forming the plated through hole in the core substrate includes: laser drilling a through hole in the core substrate; and depositing conductive material in the through hole to form a conductive bridge.

Example 39 may include the subject matter of Example 30, and may further include: depositing and patterning a third photoresist layer on the second photoresist layer to cover one or more of the one or more openings not covered by the second photoresist layer; and forming a third conductive layer in the one or more openings not covered by the second and third photoresist layers to form one or more conductive features having a third thickness, wherein the third thickness is different from the first thickness and different from the second thickness.

Example 40 may include the subject matter of Example 39, and may further include: removing the first, second, and third photoresist layers; and forming a dielectric layer on the one or more conductive features having first, second, and third thicknesses.

Example 41 may include the subject matter of Example 39, and may further specify that the third thickness is greater than the first thickness and greater than the second thickness.

The invention claimed is:

1. A microelectronic assembly, comprising:
   a package substrate including a core having a surface;
   a first conductive feature, having a first thickness and a first length, directly on the surface of the core, wherein the first conductive feature includes a trace, and wherein the first length is between 15 microns and 30 microns; and
   a second conductive feature having a second thickness directly on the surface of the core, wherein the second conductive feature includes a trace or a pad, wherein the second thickness is different than the first thickness, and wherein the second conductive feature is spaced apart from the first conductive feature by a distance between 15 microns and 30 microns.

2. The microelectronic assembly of claim 1, wherein the second thickness is greater than the first thickness.

3. The microelectronic assembly of claim 1, wherein the core has a thickness between 50 um and 150 um.

4. The microelectronic assembly of claim 1, wherein the core has a thickness between 60 um and 180 um.

5. The microelectronic assembly of claim 1, wherein the core has a thickness between 150 um and 250 um.

6. The microelectronic assembly of claim 1, wherein the first thickness is between 10 um and 30 um.

7. The microelectronic assembly of claim 1, wherein the second thickness is between 15 um and 35 um.

8. The microelectronic assembly of claim 1, further comprising:
a plated through hole in the core.

9. The microelectronic assembly of claim 1, wherein the first conductive feature is electrically coupled to an electrical signal.

10. The microelectronic assembly of claim 1, wherein the second conductive feature is electrically coupled to a power plane or a ground plane.

11. The microelectronic assembly of claim 1, further comprising:
a die electrically coupled to the package substrate.

12. The microelectronic assembly of claim 11, wherein the die is a central processing unit, a radio frequency chip, a power converter, or a network processor.

13. A microelectronic assembly, comprising:
a package substrate, the package substrate comprising:
   a core having a surface; and
   a first trace, having a first thickness and a first length, directly on the surface of the core, wherein the first length is between 15 microns and 30 microns; and
   a second trace having a second thickness directly on the surface of the core, wherein the second thickness is different than the first thickness, wherein the second trace is spaced apart from the first trace by a distance between 15 microns and 30 microns; and
a die coupled to the package substrate and electrically coupled to the first trace via conductive pathways in the package substrate.

14. The microelectronic assembly of claim 13, wherein the second thickness is greater than the first thickness.

15. The microelectronic assembly of claim 13, wherein the core has a thickness between 50 um and 150 um.

16. The microelectronic assembly of claim 13, wherein the core has a thickness between 150 um and 250 um.

17. The microelectronic assembly of claim 13, wherein the first thickness is between 10 um and 30 um.

18. The microelectronic assembly of claim 13, wherein the second thickness is between 15 um and 35 um.

19. The microelectronic assembly of claim 13, wherein the first trace is electrically coupled to an electrical signal.

20. The microelectronic assembly of claim 13, wherein the second trace is electrically coupled to a power plane or a ground plane.

* * * * *